United States Patent
Lee et al.

(10) Patent No.: US 12,376,238 B2
(45) Date of Patent: Jul. 29, 2025

(54) CIRCUIT BOARD AND METHOD FOR MANUFACTURING SAME, AND ELECTRONIC DEVICE COMPRISING SAME CIRCUIT BOARD

(71) Applicant: STEMCO CO., LTD., Cheongju-si (KR)

(72) Inventors: Sung Jin Lee, Cheongju-si (KR); Kang Dong Kim, Seoul (KR); Chang Hoon Han, Sejong (KR); Chul Ho Yoon, Cheongju-si (KR); Ho Byung Kim, Cheongju-si (KR); Hyun Woo Kim, Cheongju-si (KR); Gun Woo Shin, Cheongju-si (KR)

(73) Assignee: STEMCO CO., LTD., Cheongju-si (KR)

( * ) Notice: Subject to any disclaimer, the term of this patent is extended or adjusted under 35 U.S.C. 154(b) by 214 days.

(21) Appl. No.: 18/459,624

(22) Filed: Sep. 1, 2023

(65) Prior Publication Data
US 2023/0413453 A1    Dec. 21, 2023

Related U.S. Application Data

(63) Continuation of application No. PCT/KR2021/020232, filed on Dec. 30, 2021.

(30) Foreign Application Priority Data

Mar. 3, 2021  (KR) .................. 10-2021-0027875

(51) Int. Cl.
*H05K 3/34* (2006.01)
*H05K 1/18* (2006.01)
(Continued)

(52) U.S. Cl.
CPC .......... *H05K 3/4644* (2013.01); *H05K 1/181* (2013.01); *H05K 3/103* (2013.01); *H05K 3/3405* (2013.01);
(Continued)

(58) Field of Classification Search
CPC ................. H05K 3/3405; H05K 3/403; H05K 2201/1034
See application file for complete search history.

(56) References Cited

U.S. PATENT DOCUMENTS 5,962,917 A * 10/1999 Moriyama ........ H01L 23/49827
                                                  257/738
2002/0000895 A1* 1/2002 Takahashi ............ H05K 1/0206
                                                  333/133

(Continued)

FOREIGN PATENT DOCUMENTS

JP    2004-087921 A    3/2004
JP    2008-004904 A    1/2008

(Continued)

OTHER PUBLICATIONS

Office Action issued in KR 10-2021-0027875; mailed by the Korean Intellectual Property Office on Jan. 24, 1 2025.
(Continued)

*Primary Examiner* — Sherman Ng
(74) *Attorney, Agent, or Firm* — Studebaker Brackett PLLC

(57) ABSTRACT

A circuit board including a contact terminal on a side thereof, a method of fabricating the circuit board, and an electronic device including the circuit board are provided. The circuit board includes: a base layer; a wiring layer formed on the base layer; and a terminal section formed at a level corresponding to the wiring layer, on a first surface and a side surface of one end portion of the base layer.

13 Claims, 6 Drawing Sheets

(51) Int. Cl.
   *H05K 3/10*   (2006.01)
   *H05K 3/46*   (2006.01)
(52) U.S. Cl.
   CPC . *H05K 2201/08* (2013.01); *H05K 2203/0502* (2013.01)

(56) References Cited

U.S. PATENT DOCUMENTS

2008/0223609 A1      9/2008   Yamamoto
2008/0308305 A1*    12/2008   Kawabe ............... H05K 1/0271
                                                          174/255

FOREIGN PATENT DOCUMENTS

| JP | 2015-128086 A | 7/2015 |
| JP | 2017-135668 A | 8/2017 |
| KR | 10-2010-0053304 A | 5/2010 |
| KR | 10-2012-0084956 A | 7/2012 |
| KR | 10-2013-0022911 A | 3/2013 |
| KR | 10-2013-0049643 A | 5/2013 |
| KR | 10-2017-0029289 A | 3/2017 |

OTHER PUBLICATIONS

An Office Action; "Notice of Reasons for Refusal," mailed by the Japanese Patent Office on Aug. 13, 2024, which corresponds to Japanese Patent Application No. 2023-553336 and is related to U.S. Appl. No. 18/459,624.
International Search Report issued in PCT/KR2021/020232; mailed Apr. 7, 2022.

* cited by examiner

CIRCUIT BOARD AND METHOD FOR MANUFACTURING SAME, AND ELECTRONIC DEVICE COMPRISING SAME CIRCUIT BOARD

CROSS-REFERENCE TO RELATED APPLICATIONS

The present application is a continuation of International Patent Application No PCT/KR2021/020232, filed on Dec. 30, 2021, which is based upon and claims the benefit of priority to Korean Patent Application No. 10-2021-0027875, filed on Mar. 3, 2021. The disclosures of the above-listed applications are hereby incorporated by reference herein in their entirety.

TECHNICAL FIELD

The present disclosure relates to a circuit board, a method of fabricating the circuit board, and an electronic device including the circuit board, and more particularly, to a circuit board consisting of multiple layers, a method of fabricating the circuit board, and an electronic device including the circuit board.

BACKGROUND ART

In recent years, along with the advancement of embedded technology in electronic devices and their components, the manufacturing-related technology of printed circuit boards (PCBs) has also been continuously evolving.

Generally, PCBs can be classified based on the number of conductive layers they have, such as single-sided PCBs, double-sided PCBs, and multilayer PCBs. Multilayer PCBs, in particular, find applications in high-precision devices, such as computers, mobile phones, and high-performance communication devices.

Multilayer PCBs are constructed by stacking multiple flexible PCBs (FPCBs) with circuit patterns printed on each layer, and the circuits are electrically interconnected through through-holes.

In the case of multilayer PCBs, a bottom-side bonding (or flat bonding) method is commonly used to bond substrates, where pads formed on each substrate can be soldered together.

However, in this bonding process, defects such as shifts in the x- and y-axis directions between upper and lower substrates and warping in the z-axis direction during soldering may occur.

Additionally, visually identifying soldering bubbles and bonding defects is challenging, and the contact surface of substrates may experience folding effects.

DISCLOSURE

Technical Problems

To address the aforementioned problems, exemplary embodiments of the present disclosure provide a circuit board including contact terminals on its side surfaces, a method of fabricating the circuit board, and an electronic device including the circuit board.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

Technical Solutions

According to an aspect of the present disclosure, a circuit board includes: a base layer; a wiring layer formed on the base layer; and a terminal section formed at a level corresponding to the wiring layer, on a first surface and a side surface of one end portion of the base layer.

The terminal section may be a portion of the wiring layer.

A height of the terminal section may be the same as or less than a height of the wiring layer.

The terminal section may be formed by forming photoresist on both surfaces of the base layer and performing a plurality of exposure processes.

At least two of the exposure processes may be performed under different conditions.

The terminal section may be formed by sequentially performing exposure on an area where the terminal section is to be formed on the first surface of the base layer, an area where the wiring layer is to be formed on the first surface of the base layer, and areas where the wiring layer and the terminal section are to be formed on an opposing second surface of the base layer.

The terminal section may be bent at least once.

The terminal section may be formed of a conductive material.

A terminal formed on a side surface of the circuit board may have a height that is the same as or less than one end of a substrate in a lateral thickness direction.

The wiring layer may be a spiral coil pattern, and the terminal section may include a coil connected to the coil pattern.

According to another aspect of the present disclosure, an electronic device includes: a circuit board; a connecting conductor bonded to the circuit board using a conductive bonding material; and a device installed apart from the circuit board, wherein the circuit board includes a base layer, a wiring layer formed on the base layer, and a terminal section formed at a level corresponding to the wiring layer, on a first surface and a side surface of one end portion of the base layer.

The device may include a magnetic element.

When soldering the circuit board and the connecting conductor, a height of solder may be less than a height of the circuit board.

According to another aspect of the present disclosure, a method of fabricating a circuit board includes: once a circuit board, including a base layer, a first wiring layer, and an insulating layer, is prepared, forming a through hole in an outer region of the insulating layer; forming a metal film and plating resist on both surfaces of the circuit board; performing exposure and development on the circuit board; and forming a second wiring layer and a terminal section on a top surface and a side surface of the insulating layer.

It should be noted that the effects of the present disclosure are not limited to those described above, and other effects of the present disclosure will be apparent from the following description.

Advantageous Effects

According to exemplary embodiments of the present disclosure, by utilizing a side contact terminal, it is possible to prevent deterioration of the quality of a circuit board that may be caused by contact during soldering between the circuit board and an electronic component or between two different circuit boards.

BEST MODES FOR CARRYING OUT THE INVENTION

Figure 1:
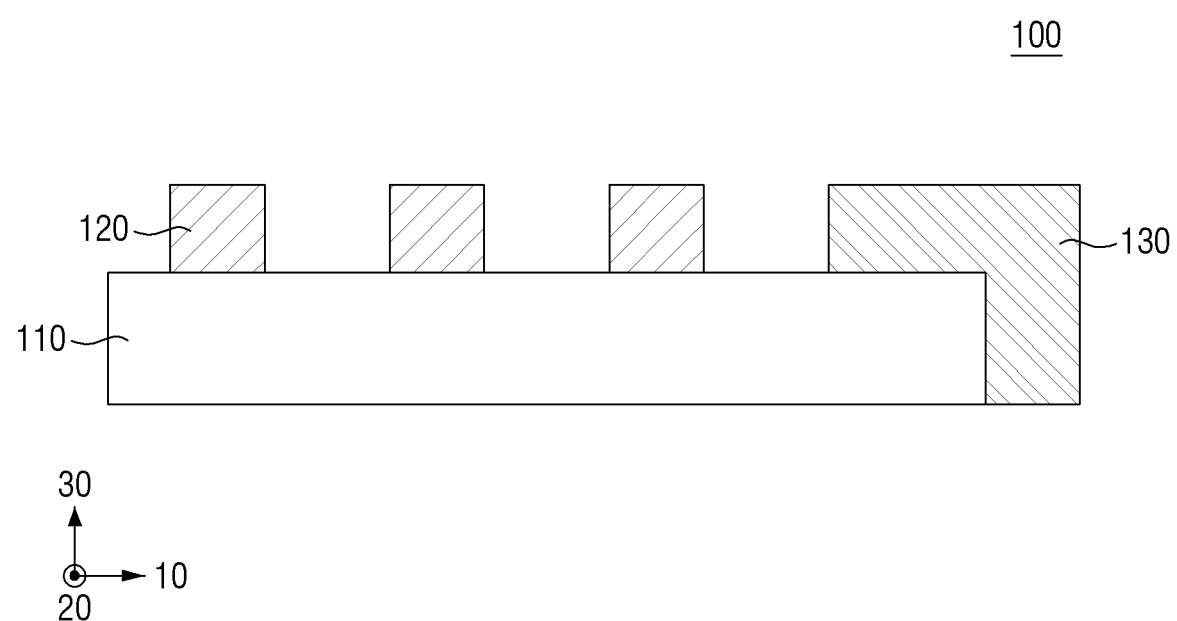
FIG. 1 is a schematic cross-sectional view illustrating the structure of a circuit board according to a first embodiment of the present disclosure.

Preferred embodiments of the present invention will hereinafter be described with reference to the accompanying drawings. The advantages and features of the present invention, as well as the methods for achieving them, will become clear by referring to the detailed embodiments provided with the attached drawings. However, it should be noted that the present invention is not limited to the disclosed embodiments but can be implemented in various different forms. The disclosed embodiments are provided to fully disclose the invention to those skilled in the art and to inform them of the scope of the invention in the technical field to which the invention pertains. The entire specification uses the same reference numerals to denote identical components.

When referring to a component or a layer as being "on" or "above" another component or layer, it includes cases where there is another layer or a different component in between. On the other hand, when a component is referred to as "directly on" or "right on top," it indicates that there is no other layer or component in between.

Spatially relative terms such as "below," "beneath," "lower," "above," "upper," etc., are used to facilitate the description of relationships between one component or element and another component or element, as depicted in the drawings. These spatially relative terms should be understood to include the directions in the drawings and may include different orientations of the components during operation or use. For example, when a component shown in the drawings is flipped, a component described as "below" or "beneath" another component can be placed "above" the other component. Therefore, the term "below," as an illustrative example, can encompass both directions of below and above. Components can also be oriented in different directions, and thus, spatially relative terms can be interpreted based on the orientations.

While terms such as "first," "second," and the like are used to describe various components, elements, and/or sections, it should be understood that these components, elements, and/or sections are not limited by these terms. These terms are merely used to distinguish one component, element, or section from another. Therefore, the "first" component, "first" element, or "first" section mentioned below may also refer to the "second" component, "second" element, or "second" section within the technical scope of the present invention.

The terms used in this specification are intended to describe exemplary embodiments and are not intended to limit the invention. In this specification, the singular form includes the plural form unless specifically mentioned otherwise. The terms "comprises" and/or "comprising" used in the specification do not exclude the presence or addition of one or more other components, steps, operations, and/or elements as described.

Unless otherwise defined, all terms used in this specification (including technical and scientific terms) are intended to have the meaning commonly understood by those skilled in the art to which the present invention belongs. Additionally, terms that are generally defined in dictionaries are not to be interpreted overly or excessively unless explicitly defined otherwise.

Embodiments of the present invention will hereinafter be described in detail with reference to the accompanying drawings. When describing the embodiments with reference to the accompanying drawings, components that are the same or corresponding, regardless of drawing symbols, will be assigned the same reference numbers, and redundant descriptions for them will be omitted.

The present invention relates to a circuit board including contact terminals on its side surfaces, a method of fabricating the circuit board, and an electronic device including the circuit board. The following detailed description of the present invention will be provided with reference to drawings and the like.

FIG. 1 is a schematic cross-sectional view illustrating the structure of a circuit board according to a first embodiment of the present disclosure.

Referring to FIG. 1, a circuit board 100 may include a base layer 110, a wiring layer 120, and a terminal section 130.

The circuit board 100 is designed to accommodate semiconductor components and may be installed in an electronic device or an electronical appliance (such as a display, a smartphone, a digital camera, etc.). The circuit board 100 may be a flexible circuit board, but may also be a rigid circuit board or a semi-rigid circuit board. Additionally, the circuit board 100 may be a single-layer or multi-layer substrate-type coil.

The circuit board 100 may include multiple layers stacked to form a multi-layer board. In this case, the wiring layers formed on each board placed on top of each other may be electrically connected through vias.

The base layer 110 forms a base. The base layer 110 may be formed as a film (or a base film) with a predetermined thickness (of, for example, 5 μm to 100 μm).

The base layer 110 may be formed of at least one material selected from various polymer materials that serve as an insulator. For example, the base layer 110 may be fabricated using at least one material selected from among polyimide, polyethylene terephthalate (PET), polyethylene naphthalate (PEN), polycarbonate, epoxy, and glass fiber.

The wiring layer 120 serves a wiring function that electrically connects semiconductor components and external electronic devices. The wiring layer 120 may be formed on one or both sides of the base layer 110 as multiple electrode lines. For example, if the circuit board 100 is a substrate-type coil, the wiring layer 120 may be formed as a coil pattern spiraling on the base layer 110.

The wiring layer 120 may be formed of at least one conductive metal selected from among nickel (Ni), chromium (Cr), copper (Cu), gold (Au), silver (Ag), platinum (Pt), aluminum (Al), etc. The wiring layer 120 may be formed on the base layer 110 using an etching method or a plating method such as an additive method, a semi-additive method, printing or coating.

The terminal section 130 is a pad formed on the circuit board 100 to establish an electrical connection between the circuit board 100 and an electronic component when mounted. In this embodiment, a portion of the wiring layer 120 designated for an external connection (e.g., an electrical connection with an electronic component) may be defined as the terminal section 130, and the terminal section 130 may be formed in an outer region of the base layer 110 at an equal height to the wiring layer 120.

The terminal section 130 can be implemented as a contact terminal for contact between the circuit board 100 and an electronic component. The terminal section 130 may be formed using a conductive material, in which case, the terminal section 130 may be implemented as a conductive contact terminal. For example, when the circuit board 100 is a substrate-type coil, the terminal section 130 may include a coil and may be formed as a connection terminal pad connected to a coil pattern.

The terminal section 130 may be formed using the same metal as the wiring layer 120. For example, the terminal section 130 may be formed using Cu, but the present embodiment is not limited thereto. The terminal section 130 may also be formed using a different metal from the wiring layer 120. Any suitable metal may be used as the constituent of the terminal section 130 as long as the terminal section 130 can serve as an electrical connection between the circuit board 100 and an electronic component.

When the terminal section 130 is formed in the outer region of the base layer 110, the terminal section 130 may be formed to range from a lateral side of the base layer 110 to a first surface of the base layer 110. In this case, the terminal section 130 may be formed in an "L" shape.

Figure 2:
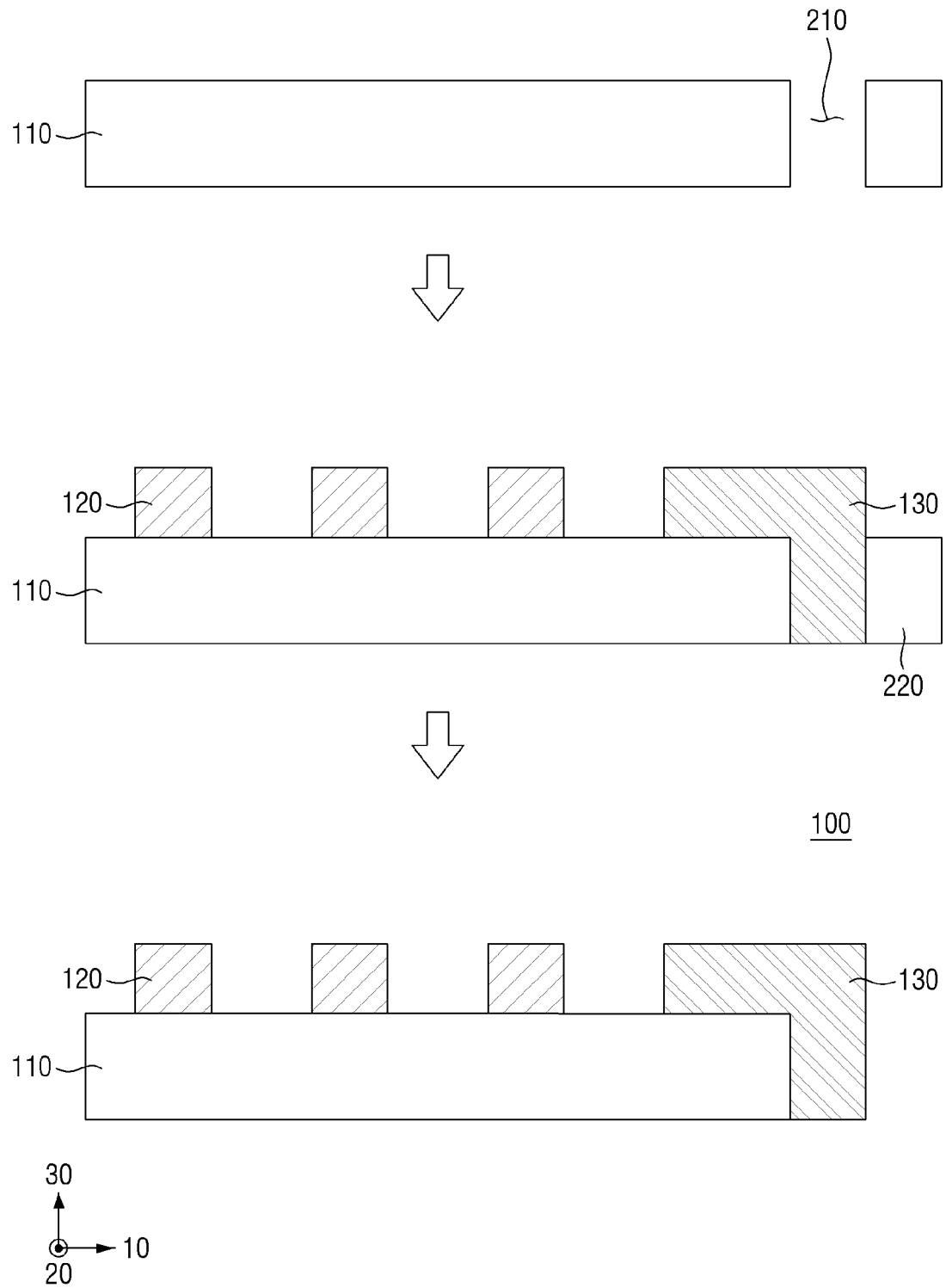
FIG. 2 is an exemplary schematic view illustrating a method of forming the terminal section of the circuit board according to the first embodiment of the present invention.

As illustrated in FIG. 2, the terminal section 130 may be formed by filling a conductive material into a through hole 210 formed in the base layer 110. Specifically, the terminal section 130 may be formed by creating the through hole 210 in the base layer 110, filling the through hole 210 when the wiring layer 120 is being formed on the base layer 110, and removing a portion of the base layer 110 located around the through hole 210. Additionally, a conductive material may be formed on the inner wall of the through hole 210 to a predetermined thickness, but not to the extent that the entire through hole 210 is filled, and a portion 220 of the base layer 110 may be removed. Furthermore, when removing the portion 220 of the base layer 110, a portion of the inner part of the through hole 210 may also be removed. FIG. 2 is an exemplary schematic view illustrating a method of forming the terminal section of the circuit board according to the first embodiment of the present invention.

Figure 3:
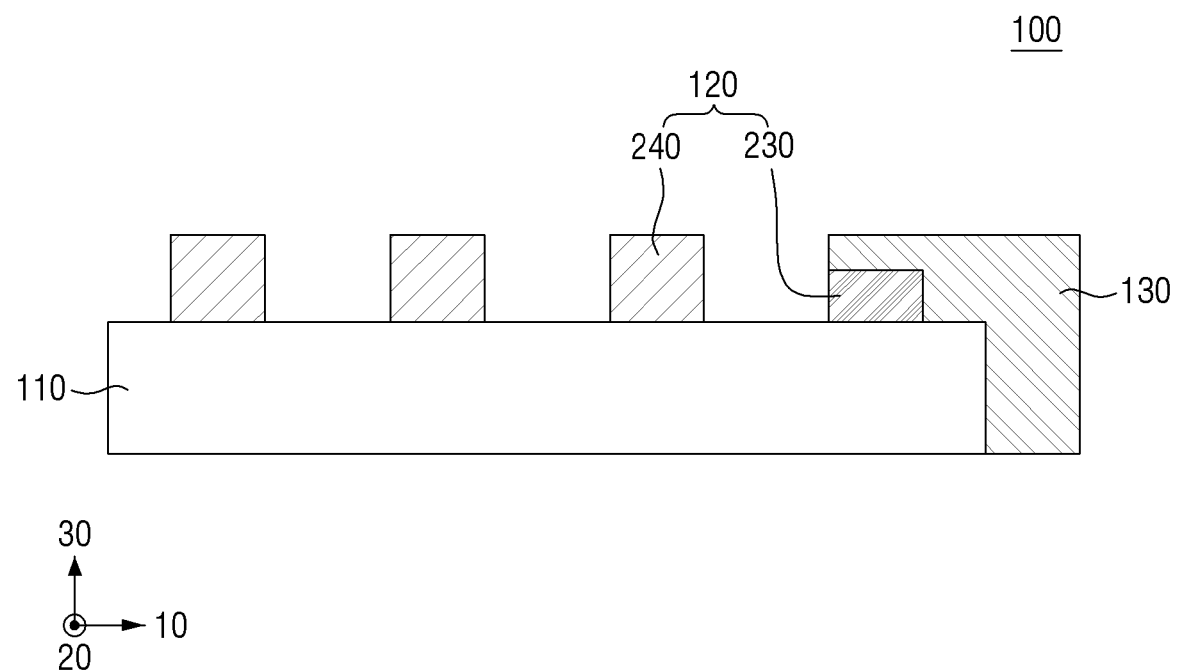
FIG. 3 is a schematic cross-sectional view illustrating the structure of the circuit board according to a second embodiment of the present invention.

On the other hand, the terminal section 130 may be formed separately from the wiring layer 120 and may also be formed to cover a first wiring 230, as illustrated in FIG. 3, while being adjacent to the side of the base layer 110. In this case, the terminal section 130 may be formed to have the same height as wirings other than the first wiring 230, such as a second wiring 240, on the base layer 110. The terminal section 130 may also be formed to have a height greater than that of the second wiring 240. FIG. 3 is a schematic cross-sectional view illustrating the structure of the circuit board according to a second embodiment of the present invention.

When the terminal section 130 is formed to cover the first wiring 230, the terminal section 130 may be formed to cover an upper portion of the first wiring 230, but the present embodiment is not limited thereto. The terminal section 130 may also be formed to cover not only the upper portion but also a side portion of the first wiring 230. In this case, the terminal section 130 may be formed to cover all or part of the upper portion of the first wiring 230, as well as all or part of the side portion of the first wiring 230.

The explanation continues referring back to FIG. 1.

When forming the terminal section 130 on the base layer 110, the same photoresist may be formed on both sides of the base layer 110, and two or more exposure processes may be performed under different conditions. This will hereinafter be described in detail.

First, a first exposure process is performed on an area where the terminal section 130 is to be formed on the first surface of the base layer 110. In the present embodiment, a half exposure may be performed up to the depth where the terminal section 130 is not formed on the inner wall of the hole.

Thereafter, a second exposure process is performed on an area where the wiring layer 120 is to be formed on the first surface of the base layer 110.

Thereafter, a third exposure process is performed on an area where the wiring layer 120 and the terminal section 130 are to be formed on an opposing second surface of the base layer 110. In the present embodiment, only a portion (e.g., half) of the terminal section 130 may be exposed.

Meanwhile, the terminal section 130 may also be used for electrical connection between the circuit board 100 and another circuit board when installing another circuit board on the circuit board 100.

Although not illustrated in FIG. 1, the circuit board 100 may include at least one of a plating layer and a protective layer.

The plating layer serves to prevent corrosion of the wiring layer 120 and the terminal section 130 and enhance the junction between the circuit board 100 and a semiconductor device, as well as the junction between the circuit board 100 and an external electronic device. The plating layer may be formed to cover the upper portions of the wiring layer 120 and the terminal section 130. The plating layer may also be formed to cover not only the upper portions but also the side portions of the wiring layer 120 and the terminal section 130.

The plating layer may be formed of an alloy of one or two conductive metals selected from among tin (Sn), Au, palladium (Pd), Ni, and Cr. The plating layer may be formed to cover all or part of each of the wiring layer 120 and the terminal section 130 before forming the protective layer on the wiring layer 120 and the terminal section 130.

The protective layer is formed on the wiring layer 120 to protect the wiring layer 120. The protective layer may be formed to cover the wiring layer 120 or the plating layer. The protective layer may be formed to cover all or part of the wiring layer 120 or all or part of the plating layer. The protective layer may also be formed to cover all or part of the terminal section 130.

The protective layer may be formed using an insulating material (e.g., solder resist), in which case, the protective layer may be formed by printing or coating a liquid solder resist. Alternatively, the protective layer may be formed by laminating a protective film (e.g., a coverlay film) onto the base layer 110 using a lamination process.

Various embodiments of the terminal section 130 that constitutes the circuit board 100 have been described with reference to FIGS. 1 through 3. The terminal section 130 according to the present embodiment is a terminal capable of allowing lateral contact, and the present embodiment pertains to a conductive contact terminal for mounting on the surface of a circuit board. Specifically, the present disclosure relates to a side terminal which is installed between the contact areas of a circuit board and an electronic component and of two or more electronic components during the process of mounting the electronic component(s) onto the circuit board and can thus allow lateral contact, rather than vertical contact.

When a terminal hole (i.e., the through hole 210) is formed to penetrate one side of at least one insulating layer (i.e., the base layer 110) that constitutes the circuit board 100, the aforementioned side terminal may be formed on a portion of the top surface of the at least one insulating layer and a portion of the side surface of the through hole. In this case, the side terminal may be bent at least once.

An electronic device including the circuit board 100 will hereinafter be described.

Figure 4:
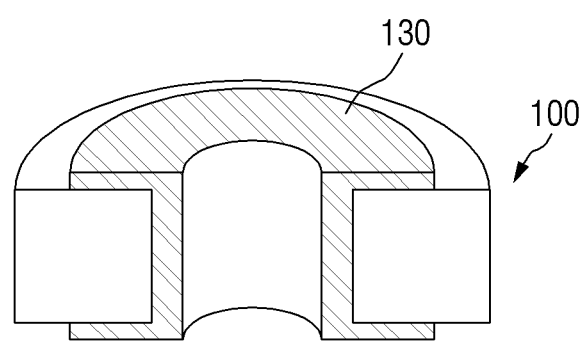
FIG. 4 is a schematic view illustrating the structure of a side terminal according to one embodiment.
Figure 5:
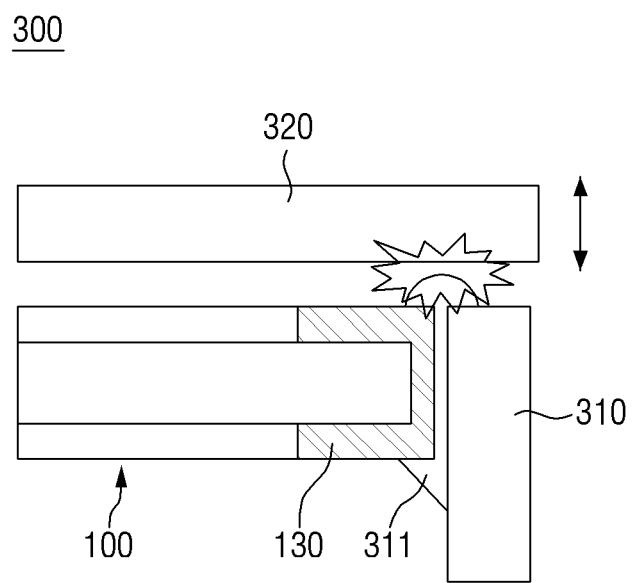
FIG. 5 is a schematic view explaining the problems associated with the side terminal of FIG. 4.
Figure 6:
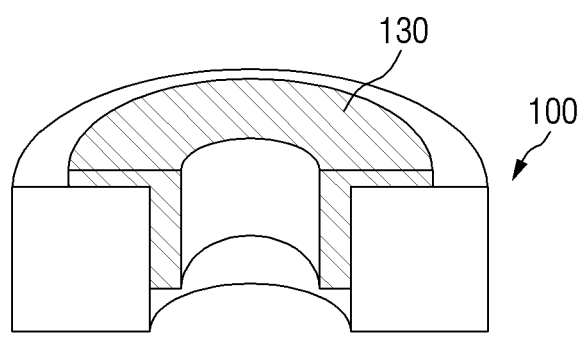
FIG. 6 is a schematic view illustrating the structure of a side terminal according to an embodiment of the present invention.
Figure 7:
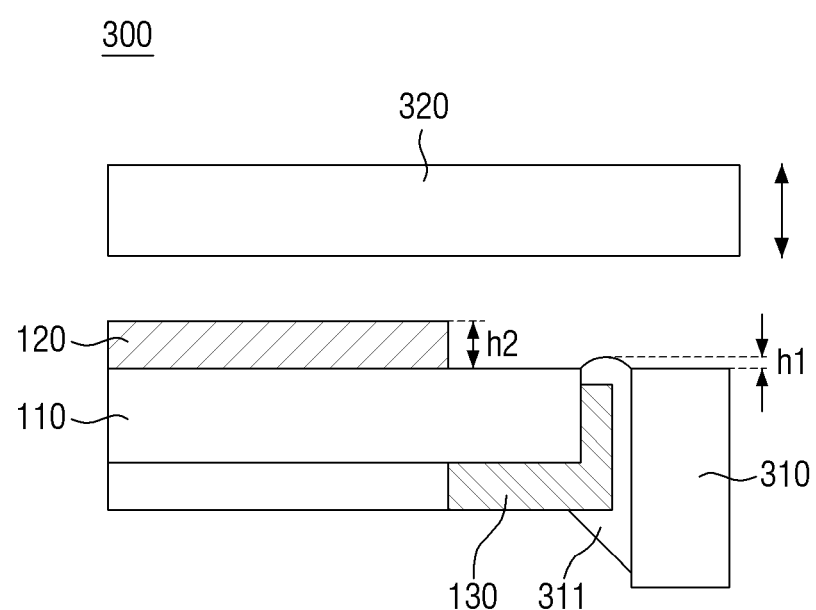
FIG. 7 is a schematic view explaining the effects of the side terminal of FIG. 6.

FIG. 4 is a schematic view illustrating the structure of a side terminal according to one embodiment, and FIG. 5 is a schematic view explaining the problems associated with the side terminal of FIG. 4. FIG. 6 is a schematic view illustrating the structure of a side terminal according to an embodiment of the present invention, and FIG. 7 is a schematic view explaining the effects of the side terminal of FIG. 6.

An electronic device 300 may include the circuit board 100, a connecting conductor 310, and a magnetic element 320. This type of configuration of the electronic device 300 may be referred to in FIGS. 5 and 7.

The connecting conductor 310 is a conductor or an electronic component that is bonded to the circuit board 100. The connecting conductor 310 may be coupled to the circuit board 100 using a conductive bonding material 311.

The connecting conductor 310 may be formed of a conductive metal material. For example, the connecting conductor 310 may be implemented as a cylindrical metal rod connected to the terminal section 130. The conductive bonding material 311 may include conductive material for bonding, such as solder.

The magnetic element 320 may be installed a predetermined distance apart from the circuit board 100. The magnetic element 320 may perform a reciprocating motion in a vertical direction (or a third direction 30) or a front-to-rear direction/a left-to-right direction with respect to the circuit board 100. The magnetic element 320 may also be inclined at a predetermined angle during its motion.

FIGS. 5 and 7 illustrate the connecting conductor 310 as being a cylindrical metal rod, but the connecting conductor 310 may also be any other circuit board, electronic component, or device. Additionally, the magnetic element 320 may be replaced by other components. In other words, the magnetic element 320 may be replaced by devices.

When considering the connecting conductor 310 as another circuit board, the circuit board 100 may be soldered to the connecting conductor 310 through solder. In this case, if in a side-terminal structure illustrated in FIG. 5, the terminal section 130 is plated into an angled "U" shape on the top surface, the bottom surface, and the side surface of the circuit board 100, the solder may move upward along the terminal section 130 and protrude beyond the tops of the terminal section 130 and the connecting conductor 310, causing an uneven coating height. This may lead to functional degradation due to contact interference with the magnetic element 320.

On the other hand, if the terminal section 130 is formed on the first surface and side surface of the circuit board 100, as illustrated in FIGS. 6 and 7, the terminal section 130 may be placed on the top surface and side surface (or the bottom surface and side surface) of the circuit board 100 in an "L" shape. In this case, even if the solder moves upward along the terminal section 130, the height of the solder decreases. As a result, the influence on the coating height during soldering between the circuit board 100 and the connecting conductor 310 is minimized, preventing contact interference with the magnetic element 320.

In the above case, a height h1 of the solder protruding beyond the base layer 110 may be less than a height h2 of the wiring layer 120 on the base layer 110 (i.e., h1>h2). Alternatively, if a protective layer is formed on the wiring layer 120, the height of the solder may be less than the height of the protective layer on the base layer 110. That is, the height of the solder is sufficient to prevent contact interference between the solder and the magnetic element 320.

A method of fabricating the circuit board 100 will hereinafter be described.

Figure 8:
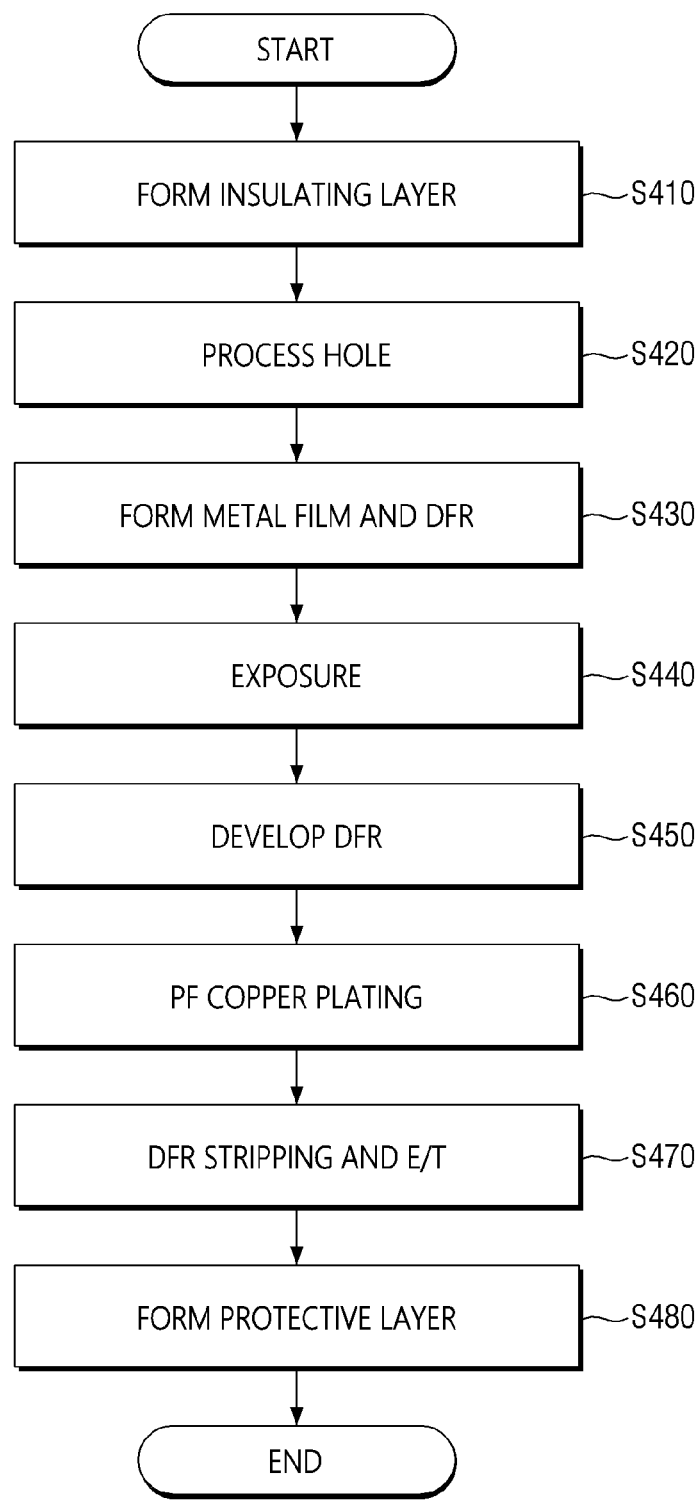
FIG. 8 is a schematic flowchart illustrating a method of fabricating a circuit board according to an embodiment of the present invention.

FIG. 8 is a schematic flowchart illustrating a method of fabricating a circuit board according to an embodiment of the present invention, for example, a method of fabricating a 4-layer substrate-type coil.

Referring to FIG. 8, first, the circuit board 100 is prepared. Specifically, a double-sided circuit layer is formed on a core polyimide (PI) board. The circuit layer will hereinafter be defined as an inner circuit. Thereafter, a double-sided insulating layer lamination may be performed on the inner circuit. The insulation layer lamination may be conducted using a roller-to-roller (R-to-R) lamination method or a hot press method.

Once the base layer 110 is prepared, subsequent steps may be sequentially performed on the base layer 110, but the present embodiment is not limited thereto. After forming the wiring layer 120 on the base layer 110, the subsequent steps may also be sequentially performed.

After forming an insulating layer on the wiring layer (S410), a blind via hole (BVH) is formed at a predetermined location on the insulating layer to connect the wiring layer 120 with an upper wiring to be formed on the insulating layer. Thereafter, the through hole 210 for forming a side pad is formed in an outer region of the circuit board 100 (S420). Here, a hole processing method such as laser drilling, computer numerical control (CNC) drilling, CNC puncher, etc., may be used.

S420 is provided in consideration of a case where the circuit board 100 is formed as illustrated in FIG. 2. On the contrary, when the circuit board 100 is formed as illustrated in FIG. 1, i.e., when the terminal section 130 is formed on the first surface and side surface of the circuit board 100, the formation of the through hole 210 may be omitted.

After the hole processing (S420), a metal film is formed on both sides of the circuit board 100, including the through hole 210, using a sputtering method (S430). Thereafter, dry film resist (DFR), which is a type of plating resist, is formed on the metal film. Specifically, a DFR lamination for forming an outer layer is performed, in which case, chargeability within the hole needs to be secured.

After the sputtering and DFR lamination (S430), exposure processes are performed on the circuit board 100 (S440). At least two exposure processes may be performed under different conditions.

For example, a first exposure process is performed on the area where the terminal section 130 is to be formed on the first surface of the base layer 110, a second exposure process is performed on the area where the wiring layer 120 is to be formed on the same surface of the base layer 110, and then, a third exposure process is performed on the areas where the wiring layer 120 and the terminal section 130 are to be formed on the opposing second surface of the base layer 110. In this case, space areas are formed in some portions of a side terminal area, which determines the height of solder.

After the exposure processes (S440), the side terminal structure is opened in an "L" shape on the first surface and side surface of the circuit board 100 in a DFR developing process (S450).

Thereafter, an upper circuit and the terminal section 130 are formed on the circuit board 100 through pattern fill (PF) Cu plating (S460).

Meanwhile, the circuit board 100 may become a final product by sequentially undergoing processes such as DFR stripping and E/T (etching) (S470) to remove the DFR pattern and metal film and the formation of a protective layer (S480).

If the circuit board 100 is a multilayer, the side terminal may also be connected to the inner circuit.

The method of manufacturing the circuit board 100 has been described so far with reference to FIG. 8. When the circuit board 100 is fabricated in this manner, external side plating can be enabled through exposure and development using a photosensitive resin. As a result, various favorable effects such as fine pattern formation, process simplification, cost reduction, and defect reduction can be enhanced, contributing to fine pattern formation and packaging for circuit boards.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

INDUSTRIAL APPLICABILITY

The present invention can be applied to a circuit board or a coil board or an electronic component or device equipped with the board.

What is claimed is:

1. A circuit board comprising: a base layer; a wiring layer formed on the base layer; and a terminal section formed at a level corresponding to the wiring layer, on a first surface and a side surface of one end portion of the base layer, wherein a terminal formed on a side surface of the circuit board has a height that is less than one end of a substrate in a lateral thickness direction.

2. The circuit board of claim 1, wherein the terminal section is a portion of the wiring layer.

3. The circuit board of claim 1, wherein a height of the terminal section is the same as or less than a height of the wiring layer.

4. The circuit board of claim 1, wherein the terminal section is formed by forming photoresist on both surfaces of the base layer and performing a plurality of exposure processes.

5. The circuit board of claim 4, wherein at least two of the exposure processes are performed under different conditions.

6. The circuit board of claim 4, wherein the terminal section is formed by sequentially performing exposure on an area where the terminal section is to be formed on the first surface of the base layer, an area where the wiring layer is to be formed on the first surface of the base layer, and areas where the wiring layer and the terminal section are to be formed on an opposing second surface of the base layer.

7. The circuit board of claim 1, wherein the terminal section is bent at least once.

8. The circuit board of claim 1, wherein the terminal section is formed of a conductive material.

9. The circuit board of claim 1, wherein the wiring layer is a spiral coil pattern, and the terminal section includes a coil connected to the coil pattern.

10. An electronic device comprising: a circuit board; a connecting conductor bonded to the circuit board using a conductive bonding material; and a device installed apart from the circuit board, wherein the circuit board includes a base layer, a wiring layer formed on the base layer, and a terminal section formed at a level corresponding to the wiring layer, on a first surface and a side surface of one end portion of the base layer, wherein a terminal formed on a side surface of the circuit board has a height that is less than one end of a substrate in a lateral thickness direction.

11. The electronic device of claim 10, wherein the device includes a magnetic element.

12. The electronic device of claim 10, wherein when soldering the circuit board and the connecting conductor, a height of solder is less than a height of the circuit board.

13. A method of fabricating a circuit board, comprising: once a circuit board, including a base layer, a first wiring layer, and an insulating layer, is prepared, forming a through hole in an outer region of the insulating layer; forming a metal film and plating resist on both surfaces of the circuit board; performing exposure and development on the circuit board; and forming a second wiring layer and a terminal section on a top surface and a side surface of the insulating layer, wherein a terminal formed on a side surface of the circuit board has a height that is less than one end of a substrate in a lateral thickness direction.

* * * * *